United States Patent [19]
May et al.

[11] Patent Number: 5,258,655
[45] Date of Patent: Nov. 2, 1993

[54] APPARATUS FOR ELECTRICALLY SWITCHING BETWEEN PERIPHERAL DEVICES

[75] Inventors: Gregory J. May; Steven L. Harper, both of Corvallis, Oreg.

[73] Assignee: Hewlett-Packard Company, Palo Alto, Calif.

[21] Appl. No.: 780,606

[22] Filed: Oct. 23, 1991

[51] Int. Cl.$^5$ ............................................. H01H 9/00
[52] U.S. Cl. ...................................... 307/139; 307/39; 307/40; 307/125
[58] Field of Search ................ 307/11, 38, 39, 40, 307/41, 112, 116, 125, 139

[56] References Cited

U.S. PATENT DOCUMENTS

| | | | |
|---|---|---|---|
| 4,674,031 | 6/1987 | Siska, Jr. | 307/38 |
| 4,682,294 | 7/1987 | Duc et al. | 307/38 |
| 4,956,561 | 9/1990 | Tamer | 307/40 |

OTHER PUBLICATIONS

"Smart Switches save money, boost productivity & make your job easier." INMAC®, Jun. 1991 catalog. pp. 60 and 61.

Primary Examiner—Jeffrey A. Gaffin

[57] ABSTRACT

The apparatus allows the connection of two peripherals to a host device through one port and switching between them. The apparatus includes a sensor for sensing a data signal from the second peripheral device and a switch responsive to the sensor. The switch in a default, first state connects the first peripheral device to the host device and in a second state disconnects the first peripheral device therefrom. If a second peripheral device is connected to the apparatus, the sensor senses a data signal from the device and communicates this sensing to the switch. The switch responds by disconnecting the first device from the host device, leaving the second device solely connected to the host device. If the second peripheral device is disconnected from the apparatus, the switch reconnects the first peripheral device to the host device.

20 Claims, 1 Drawing Sheet

APPARATUS FOR ELECTRICALLY SWITCHING BETWEEN PERIPHERAL DEVICES

BACKGROUND OF THE INVENTION

This invention relates to apparatus for allowing multiple peripheral devices to share a host device. More particularly, this invention relates to an apparatus for switching a host device from a first peripheral device to a second peripheral device upon sensing the presence of the second device. The term "host device" is used herein to described a device to which it is desirable to connect a number of other devices referred to as "peripheral devices." A host device can be a computer to which it is desired to connect peripheral devices such as a modem, printer and plotter. Similarly, a host device can also be a printer to which it is desired to connect peripheral devices in the form of a number of computers.

Computers, calculators, printers and other computer-related devices have a limited number of ports to which other devices may be physically connected. Portable computers such as notebook- or palm-sized devices may have only a single serial port to handle all peripheral devices. With such computing devices a user must repeatedly plug and unplug different peripheral devices as they are required. This effort can prove to be timeconsuming as well as increase the risk of misplacing a peripheral device when it is not plugged in to the computing device's port.

Prior apparatus are known for switching between peripheral devices and have been used for connecting multiple computers to a single printer or multiple printers and plotters to a single computer. These apparatus fall into two broad categories: those that require the user to operate a switch to make a desired connection, and those that scan the multiple ports to look for activity. The apparatus in the first category need not be powered, while those in the second category (known as "smart" switches) require an external, constant source of power, usually from the host device power line.

Both types of switching apparatus have drawbacks. The manually-operable apparatus require user intervention to determine which peripheral device is connected to the host device at a given time. On the other hand, "smart" switching apparatus require constant power, which is not acceptable where the host device is portable and powered by batteries.

The present invention has the advantages of both of these prior types of apparatus without their attendant drawbacks.

SUMMARY OF THE INVENTION

An object of the invention, therefore, is to provide an improved switching apparatus that overcomes the drawbacks of the prior art.

Another object of the invention is to provide such an apparatus that senses a data signal of one peripheral device and in response disconnects another peripheral device from the host device.

Still another object of the invention is provide such an apparatus that requires no constant power from the host device or a peripheral device but instead draws what power it needs from the data signals passing among the various devices.

To achieve these objects, an apparatus according to the invention for switching between peripheral devices coupled to a host device includes a sensor for sensing a data signal from a second peripheral device to the host device. A switch responsive to the sensor has a first state for connecting a first peripheral device to the host device and a second state for disconnecting the first peripheral device from the host device. When the sensor senses a data signal from the second peripheral device, the switch switches from the first state to the second state to disconnect the first peripheral device from the host device.

In one aspect of the invention, the switch may be responsive to the sensing of a binary data signal from the second peripheral device, such as of the type defined in the RS-232 communication standard. In another aspect of the invention, a storage device is provided for temporarily storing the data signal from the second peripheral device because of its binary nature.

In another aspect of the invention, the apparatus according may not require constant power. Rather, power for operating the sensor and switch is drawn from the data signals of the host device or the peripheral devices.

The foregoing and other objects, features, and advantages of the invention will become more apparent from the following detailed description of a preferred embodiment which proceeds with reference to the accompanying drawings.

DESCRIPTION OF A PREFERRED EMBODIMENT

Figure 1:
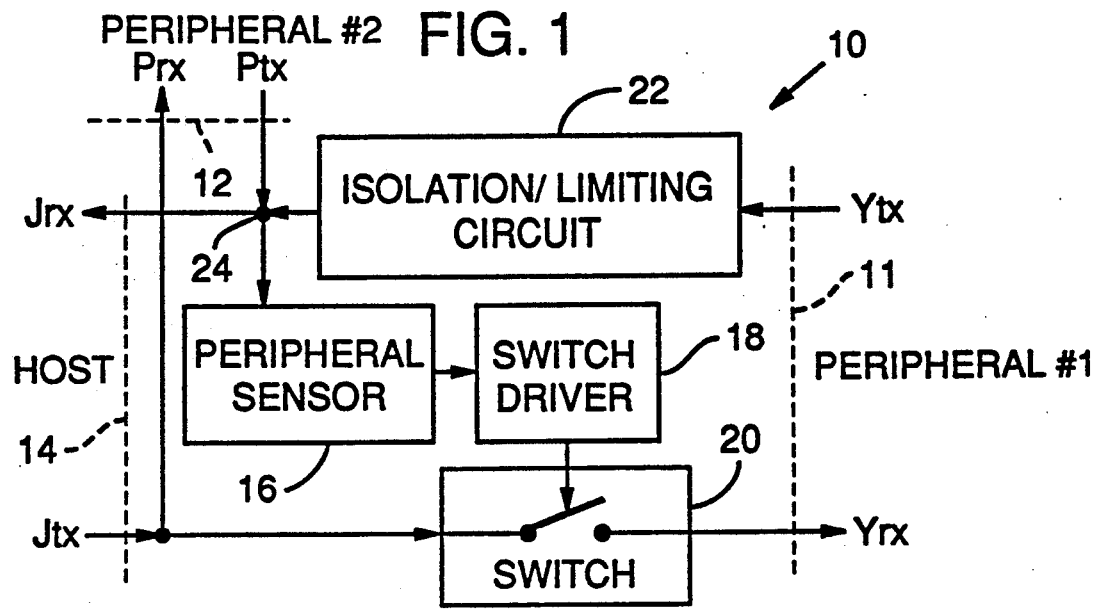
FIG. 1 is a functional block diagram of an apparatus according to the invention.

Referring to FIG. 1, a switching apparatus 10 according to the invention is shown with three ports 11, 12 and 14 illustrated by dashed lines. Port 11 may be connected through a conventional connector (not shown) to a first peripheral device which sends data signals on line Ytx to a host device and receives data signals on line Yrx from the host device. Port 12 may be connected through a conventional connector (not shown) to a second peripheral device which sends data signals on line Ptx to a host device and receives data signals on line Prx from the host device. Port 14 may be connected through another conventional connector (not shown) to a host device. The host device sends data signals on line Jtx to one of the peripheral devices and receives data on line Jrx from the same peripheral device in a manner to be described. Although the illustrated embodiment is an example of the invention for sending and receiving serial data signals from the peripheral devices, the invention may be used for parallel data transmission as well.

Within apparatus 10 is a peripheral sensor 16 that senses data signals being sent from the second peripheral device on line Ptx to the host device on line Jrx. In these peripheral devices the data signals are binary and have two levels to indicate logic 0 and logic 1, with logic 1 typically a negative or lower voltage and logic 0 a positive or higher voltage. A typical ASCII character sent serially with such data signals has ten or more bits including the character itself and framing bits. The sensor 16 communicates with a switch driver 18 which in turn operates a switch 20 connected between line Yrx and line Jtx. The switch 20 has two states: a closed state for connecting the first peripheral device to the host devices via lines Yrx and Jtx and an open state for disconnecting the two devices by breaking an electrical connection between the two lines. Through switch driver 18, switch 20 is responsive to peripheral sensor 16 for switching from the closed state to the open state when the sensor senses a data signal from the second peripheral device. The switch 20 is also responsive to the absence of the data signal to switch back to the closed state. In this particular embodiment, the data signal may appear to be absent momentarily because it is a serial signal with both positive and negative values. To insure that the switch 20 does not switch states during a transition of the data signal, the peripheral sensor includes a storage device for storing a data signal of one polarity for a predetermined time longer that the time of typical signal transitions. "Break" signals which are space conditions that last longer than a character transmission and have a constant value are also possible. The storage device is designed to store a previous data signal for sufficient time to distinguish a break signal from a disconnection of the second peripheral device.

Also within the apparatus 10 is an isolation and limiting circuit 22 connected between the Ytx line and the Jrx line. The circuit 22 contains two types of devices. A limiting device included within the circuit 22 limits the effect of a data signal from the first peripheral device so that the peripheral sensor 16 does not interpret the data signal as originating from the second peripheral device. An isolation device included within the circuit isolates the peripheral devices from each other by preventing a data signal from one peripheral device from adversely affecting the other peripheral device. The circuit 22 allows the lines Ptx, Ytx and Jrx to all share the same node 24, thereby simplifying the design of apparatus 10.

Although FIG. 1 a functional block diagram, it accurately shows the power connections for the peripheral sensor 16 and switch 20. The sensor 16 draws its power for sensing from data signals of the second peripheral device. The switch 20 draws its power from the data signals of the host device. Thus no constant power source is required for the apparatus 10 from the host or peripheral devices. This minimizes the power required from these devices, which are likely portable and have limited power supplies such as batteries.

In its default condition where a second peripheral device is either not connected to the port 12 or, if connected, is not active, the switch 20 is closed and the first port 11 is connected to the third port 14. A first peripheral device connected to the first port 11 is thus coupled to a host device connected to the third port. Isolation and limiting circuit 22 prevents data signals from the first peripheral device from being effectively sensed by sensor 16, which would otherwise cause switch 20 to disconnect port 11. If a second peripheral device now is either connected to the port 12 or, if connected, is now activated, peripheral sensor 16 senses data signals from the second peripheral device and causes switch driver 18 to open switch 20. This action disconnects port 11 from port 14. Port 12 is shown always connected to port 14, which simplifies the design.

It would be possible to disconnect port 12 from port 14 while port 11 is active if desired by adding similar switches and sensors. Alternatively, circuit 22 could be designed to drive a load on port 12 when the second peripheral device is powered down.

Figure 2:
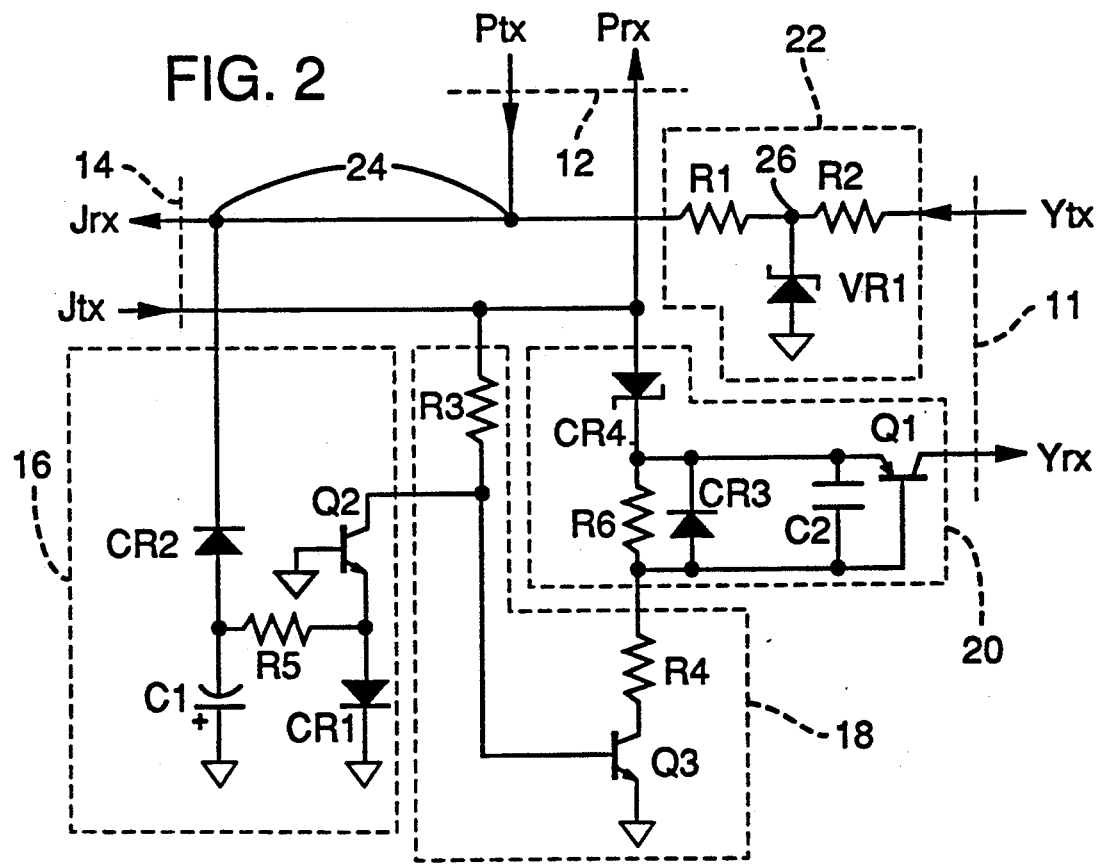
FIG. 2 is a schematic diagram of a preferred embodiment of the apparatus shown in FIG. 1.

FIG. 2 is a circuit schematic diagram of one implementation of the preferred embodiment. Other circuit designs are, of course, possible, such as digital, analog, discrete and integrated versions using TTL, CMOS and FET equivalent devices. But the illustrated circuit has advantages of not requiring an internal power supply, of reliability, of low cost and of performance. Operation of the circuit of FIG. 2 is best understood by describing two cases: 1) a first peripheral device is presently connected to the port 11 and a second active peripheral device has just been connected to the port 12, and 2) the second peripheral device has just been disconnected.

In the first case, the data signals from the second peripheral are passed via line Ptx and node 24 to line Jtx and to the peripheral sensor 16. Sensor 16 in this circuit includes a diode CR2 oriented to pass current toward node 24. Connected to the anode side of the diode is a capacitor C1 and a resistor R5, that comprise a form of a data signal storage device. Connected to R5 are a protection diode CR1 and the emitter of a transistor Q2. The base of Q2 is connected to ground and the emitter is connected to a pull-up resistor R3 which is connected at its other end to line Jtx.

The initial data signals from a peripheral device are mark signals indicating the presence of the device. These mark signals are typically a negative voltage of a sufficient magnitude to cause Q2 to turn on by drawing the voltage on the emitter of Q2 a diode drop below the base voltage of zero volts. The present circuit is optimized to handle data signals of −3v on line Ptx, although Q2 begins to turn on once Ptx is at −1.2v. Q2 is configured to saturate after it is turned on, which produces about a 0.2v drop from the collector to the emitter. This drop draws the collector voltage on Q2 down to about −0.4v, insufficient to turn on the switch driver 18 as will be explained.

The data signal from the second peripheral device is not a constant negative voltage for the reasons described above. When the negative data signal is absent temporarily and replaced by a positive voltage signal indicating a logic 0, the storage device comprised in this embodiment of C1 and R5 maintains at least −0.6v at the emitter of Q2 for a predetermined time. The time constant of the capacitor-resistor pair is such that the negative voltage is maintained sufficiently to outlast break signals. But the time constant is not so long as to prevent the timely closing of the switch 20 to pick up data transmitted from the first peripheral device.

The switch driver 18 comprises a transistor Q3, resistor R3 and a current limiting resistor R4 connected between the collector of Q3 and the switch 20. The emitter of Q3 is tied to ground and thus Q3 requires about 0.6v on its base in order to turn on and conduct. So long as Q3 is off, switch 20 is open and line Yrx is disconnected from line Jtx. Therefore with Q2 driven into saturation by a negative data signal from Ptx, the base voltage of Q3 is about −0.4v and Q3 remains off. However, if Q2 is off, the base voltage of Q3 is pulled up by the pull-up resistor R3 that connects the base to line Jtx.

The switch 20 includes a diode CR4 oriented to pass current from line Jtx to line Yrx and a PNP transistor Q1. Connected across the emitter and base of Q1 are a resistor R6, a diode CR3 and a capacitor C2. The base of Q1 is also connected to R4 so that Q1 conducts (i.e., closes) when Q3 is on and the base current of Q1 can flow into the collector of Q3.

The first peripheral device in some embodiments of the invention may work with TTL level signals of 0 and 5v data signals rather than RS-232 negative and positive voltages. In such a case, CR4 is provided between lines Jtx and switch 20 to avoid forcing Yrx below ground when line Jtx is negative. CR3 and C2 are provided for protection of Q1 from electrical spikes and to insure that Q1 does not change state during voltage transitions on line Jtx.

The isolating and limiting circuit 22 protects the two peripheral devices from adversely affecting the other. The circuit 22 includes a Zener diode VR1 connected between ground and node 26. VR1 has a forward voltage drop of about 0.6v and a breakdown voltage of about 5.1v. Circuit 22 also includes current limiting resistors R1 and R2. With Ptx active and transmitting a positive voltage as great as 15v, the driver circuitry of the first peripheral device (not shown) which is connected to line Ytx must be protected. Diode VR1 limits the voltage at node 26 to a maximum voltage that the driver circuitry can safely withstand. R1 protects VR1 against excessive current from the peripheral device on line Ptx. R2 works in a similar manner to protect VR1 when line Ytx is at a significant positive voltage.

In the second case, the second peripheral device is now disconnected from port 12. Q2 turns off and Q3 is controlled by the data signal voltage on line Jtx through R3. If the signal voltage is positive (typically at least 5v), then Q3 turns on. With Q3 on, Q1 turns on, closing the connection between line Jtx and line Yrx. If the signal voltage is negative, Q2 goes into reverse operation to limit the voltage at its collector to about −0.6v and Q3 is off. Line Yrx is pulled to zero volts by a pull-down load resistor to ground (not shown) within the first peripheral device. Zero volts corresponds to a "negative" data signal in this particular case.

At circuit 22, diode VR1 limits the magnitude of the negative voltage of the data signal from the first peripheral device on line Ytx to about −0.6v at node 24. This voltage is not low enough to overcome the two diode drops of CR2 and Q2, and thus Q2 does not mistakenly turn on. Resistor R2 also limits the current drawn to protect VR1.

Having illustrated and described the principles of the invention in a preferred embodiment, it should be apparent to those skilled in the art that the invention can be modified in arrangement and detail without departing from such principles. For example, multiple switches and sensors may be included for handling priority among several peripheral devices. The apparatus 10 may include complementary switches and sensors to allow the peripheral devices to use RS-232 signal levels, TTL signal levels, or other signal levels. The parameter of the data signal sensed may be phase, frequency, magnitude or any other uniquely associated with the signal. We therefore claim all modifications and equivalents coming within the spirit and scope of the following claims, which are not limited to the examples described herein.

We claim:

1. An apparatus for switching between first and second peripheral devices for a host device, comprising:
   a sensor for sensing a binary signal from a second peripheral device actively connected to the host device; and
   a switch having a first state for connecting a first peripheral device to the host device and a second state for disconnecting the first peripheral device from the host device, the switch responsive to the sensor for switching from the first state to the second state to disconnect the first peripheral device from the host device once the second peripheral device is actively connected.

2. The apparatus of claim 1 wherein the switch is responsive to the sensing of the binary signal from the second peripheral device for switching from the first state to the second state and responsive to the absence of the data signal from switching back from the second state to the first state.

3. The apparatus of claim 1 wherein the sensor includes a storage device for temporarily storing the signal from the second peripheral device.

4. The apparatus of claim 1 wherein the sensor comprises a transistor.

5. The apparatus of claim 1 wherein the sensor is constructed to sense RS-232 signal levels.

6. The apparatus of claim 1 wherein the switch is constructed to draw power from a binary signal from the host device or first peripheral device.

7. The apparatus of claim 1 wherein the sensor is constructed to draw power from a binary signal from the second peripheral device.

8. The apparatus of claim 1 including an isolation device for preventing a binary signal from one peripheral device from adversely affecting the other peripheral device.

9. The apparatus of claim 8 wherein the isolation device comprises a resistor.

10. The apparatus of claim 8 wherein the isolation device comprises a Zener diode.

11. The apparatus of claim 1 including a limiting device for limiting the effect of a binary signal received from the first peripheral device so that the sensor does not interpret the binary signal as originating from the second peripheral device.

12. The apparatus of claim 11 wherein the limiting device comprises a diode.

13. An apparatus for electrically switching between peripheral devices for a host device, comprising:
   a first port for connecting to a first peripheral device;
   a second port for connecting to a second peripheral device;
   a sensor for sensing a binary signal sent to the host device from a second peripheral device actively connected to the second port; and
   a switch connected between the first port and the host device and responsive to the sensing of a binary signal sent from the second peripheral device for disconnecting the first port from the host device.

14. The apparatus of claim 13 wherein the switch is constructed to draw power from a binary signal from the host device or first peripheral device.

15. The apparatus of claim 13 wherein the switch is responsive to the absence of a data signal sent from the second peripheral device for reconnecting the first port to the third port.

16. The apparatus of claim 13 including an isolation device for preventing a binary signal from one peripheral device from adversely affecting the other peripheral device.

17. The apparatus of claim 13 including a limiting device for limiting the effect of a binary signal received from the first peripheral device so that the sensor does not interpret the binary signal as originating from the second peripheral device.

18. A method of switching between peripheral devices for a host device, comprising:

providing first and second ports through which first and second peripheral devices are coupled to a host device;

sensing active connection of a second peripheral device to the second port; and in response to sensing the active connection, disconnecting the first port and thereby the first peripheral device from the host device.

19. The method of claim 18 wherein the sensing step comprises sensing the presence of a binary signal from the second peripheral.

20. The method of claim 18 including sensing the absence of the second peripheral at the second port and in response reconnecting the first port to the host device.

* * * * *